(12) United States Patent
Chen et al.

(10) Patent No.: US 10,892,767 B1
(45) Date of Patent: Jan. 12, 2021

(54) HIGH ACCURACY MATCHING SYSTEM AND METHOD THEREFOR

(71) Applicant: NXP USA, INC., Austin, TX (US)

(72) Inventors: Tao Chen, Austin, TX (US); Robert S. Jones, III, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/577,122

(22) Filed: Sep. 20, 2019

(51) Int. Cl.
*H03M 1/06* (2006.01)
*G05F 3/26* (2006.01)
*H03M 1/12* (2006.01)

(52) U.S. Cl.
CPC ............ *H03M 1/066* (2013.01); *G05F 3/267* (2013.01); *H03M 1/1245* (2013.01)

(58) Field of Classification Search
CPC ...... H03M 1/066; H03M 1/1245; G05F 3/267
USPC ........................................................ 341/135
See application file for complete search history.

(56) References Cited

U.S. PATENT DOCUMENTS

| | | | | |
|---|---|---|---|---|
| 6,452,527 B2* | 9/2002 | Takeya | ................... | H03M 1/066 341/144 |
| 9,941,852 B1 | 4/2018 | Abughazaleh et al. | | |
| 10,386,243 B2* | 8/2019 | Abughazaleh | ........... | G01K 7/01 |
| 10,432,208 B2* | 10/2019 | Inoue | ..................... | H03M 1/066 |
| 2011/0227629 A1* | 9/2011 | Chang | ................... | H03M 1/066 327/415 |
| 2012/0086591 A1* | 4/2012 | Suryono | ............. | H03M 1/0668 341/143 |

OTHER PUBLICATIONS

Van De Plassche, R., "Dynamic Element Matching for High-Accuracy Monolithic D/A Converters", IEEE Journal of Solid-State Circuits, vol. SC-11, No. 6, Dec. 1976.
Zeng, T., "An Order-Statistics Based Matching Strategy for Circuit Components in Data Converters", IEEE Transactions on Circuits and Systems—I: Regular Papers, vol. 60, No. 1, Jan. 2013.

* cited by examiner

*Primary Examiner* — Brian K Young

(57) ABSTRACT

A circuit for high accuracy element matching is provided. The circuit includes an analog to digital converter (ADC) configured to generate an output code. A current source is configured to provide a signal to the ADC. The current source includes a first current branch including a first unit element group having a first unit element coupled by way of a first set of switches to a first node and a second node and a second unit element coupled by way of a second set of switches to the first node and the second node. A second current branch includes a second unit element group having a third unit element coupled by way of a third set of switches to the first node and the second node and a fourth unit element coupled by way of a fourth set of switches to the first node and the second node. A control circuit is configured to provide control signals to the sets of switches based on the output code. The control circuit is further configured to sort unit element currents and to dynamically switch unit elements.

20 Claims, 9 Drawing Sheets

HIGH ACCURACY MATCHING SYSTEM AND METHOD THEREFOR

BACKGROUND

Field

This disclosure relates generally to element matching, and more specifically, to a matching system and method that improves accuracy while minimizing the number of unit elements implemented in the design.

Related Art

Today, it is important to monitor temperatures on an integrated circuit (IC) die, or chip. For example, it is important to manage the on-die temperature in a multi-core system on chip (SoC) due to excessive leakage current that results in increases in temperature within the die circuitry. A temperature sensor can be used to monitor the temperature of an electronic component, such as a central processing unit (CPU), graphics processing unit (GPU), microprocessor unit (MPU), SoC, and the like. When a sensed temperature exceeds predetermined thresholds, the sensor may alert circuitry to reduce power consumption and thus reduce the temperature so that overheating that can cause destructive failure to the component may be prevented. In many cases, however, such sensors exhibit poor temperature measurement accuracy and can cause delay in reducing power, subjecting the component to excessive temperatures for longer periods.

BRIEF DESCRIPTION OF THE DRAWINGS

The present invention may be better understood, and its numerous objects, features, and advantages made apparent to those skilled in the art by referencing the accompanying drawings.

FIGS. 11A, 11B, 110, 11D, 11E, 11F, and 11G are bar graphs depicting example steps of a dynamic ordered element matching (DOEM) process, according to some embodiments of the present disclosure.

The present invention is illustrated by way of example and is not limited by the accompanying figures, in which like references indicate similar elements, unless otherwise noted.

Elements in the figures are illustrated for simplicity and clarity and have not necessarily been drawn to scale.

DETAILED DESCRIPTION

The following sets forth a detailed description of various embodiments intended to be illustrative of the invention and should not be taken to be limiting.

Figure 1:
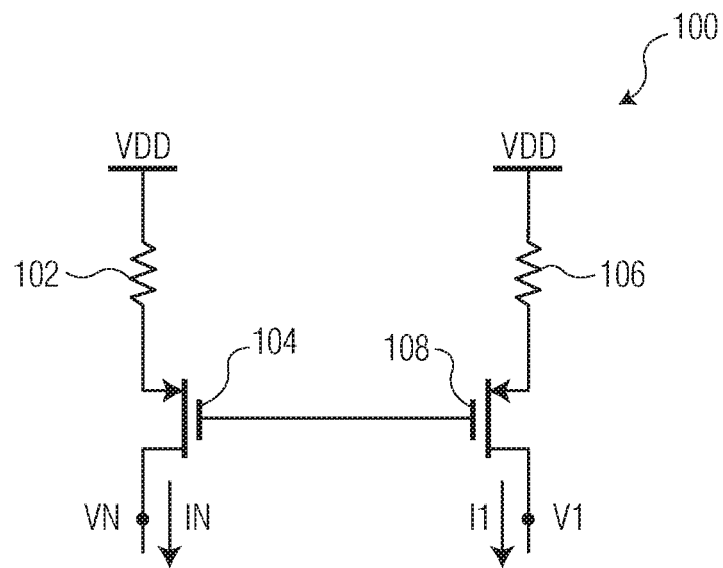
FIGS. 1 and 2 are schematic diagrams depicting example current mirrors.

Current mirrors are implemented in a variety of applications, such as temperature sensors, data converters, bandgap reference generators, and the like. Current mirrors are often used to implement a desired current ratio of N to 1 (or N:1) by generating a current through a first branch that has a magnitude N times larger than the magnitude of a current through a second branch. A conventional current mirror 100 is shown in FIG. 1, which implements circuitry to produce the desired currents IN in the first branch and I1 in the second branch according to the ratio N:1. In the example shown, current mirror 100 implements a first resistor 102 coupled between a first voltage supply (e.g., VDD) and a source electrode of a first transistor 104 in the first branch (where the source electrode is identified by an inward pointing arrow), and a second resistor 106 coupled between the first voltage supply and a source electrode of a second transistor 108, where the resistance value of the first resistor 102 may be N times smaller than the resistance value of the second resistor 106. The first transistor 104 may also be sized N times larger than the second transistor 108 to ensure the first transistor 104 is capable of carrying the N times greater current in the first branch. However, process abnormalities may occur during wafer fabrication, causing deviation from the desired dimension values among the devices implemented in circuitry on the wafer, such as different lengths, widths, and heights of materials forming the resistors and transistors. This deviation alters the current flowing through each resistor and transistor, and ultimately affects the current ratio actually implemented by the current mirror. In other words, this deviation or device mismatch causes error in the output of the current mirror, or deviation from the expected or desired output of the current mirror.

Figure 2:
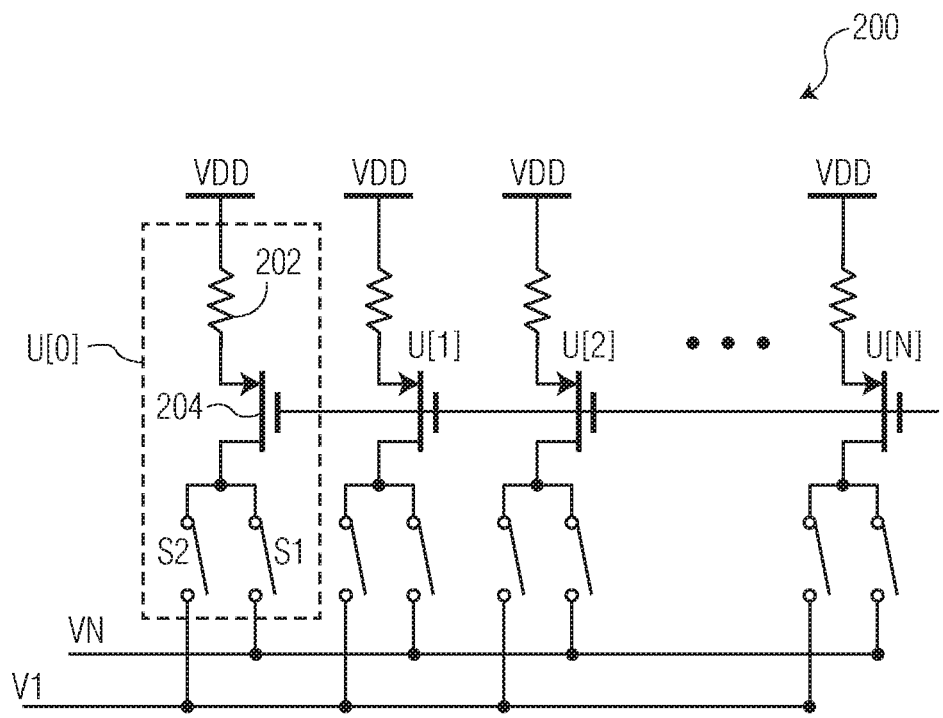

To combat device mismatch, some current mirror designs may implement a conventional matching scheme, which selects a number of unit elements to implement the desired current magnitudes in each branch, like the current mirror 200 shown in FIG. 2. To achieve an N:1 ratio, an N+1 number of unit elements are used. Each unit element U[1] (where i is an integer from 0 to N) implements a unit resistor 202 coupled between the first voltage supply and a source electrode of a unit transistor 204. Each unit element U[1] provides a unit measurement of current that may be output at the drain electrode of the unit transistor 204, where the unit current is equal to In order to implement the ratio N:1, an N number of the unit elements are selected and coupled to a first output node (labeled VN) of the first branch to achieve the first current, while one of the unit elements is selected and coupled to a second output node (labeled V1) of the second branch to achieve the second current. Together, the N number of unit elements provide the N times greater current at the first output node, as compared with the single unit element providing the (unit) current at the second output node.

A conventional dynamic element matching (DEM) scheme may be used to average out the current at the output of the device in which the current mirror is implemented, which attempts to average out the error arising from device mismatch. For example, a current mirror may be implemented in a voltage generator, which outputs a voltage Vout.

As shown in FIG. 2, the drain electrode of each unit element U[i] in the current mirror may be coupled by a first switch S1 to the first output node VN and by a second switch S2 to the second output node V1. The DEM scheme selects a single unit element from the N+1 elements and couples the single unit element to the second branch at the second output node, while coupling the rest of the N+1 elements to the first branch at the first output node, and takes a first sample of Vout. An analog to digital converter (ADC) may be used to take the samples. The DEM scheme then selects a next single unit element from the N+1 elements to couple to the second branch, with the remaining elements coupled to the first branch, and takes another sample of Vout. The DEM repeats this process during runtime of the voltage generator, iterating or rotating through each of the N+1 elements as the single unit element, and averaging the N+1 Vout samples to achieve an averaged output. While each unit element U[i] may deviate from the desired dimension values, iterating through the different combinations of unit elements U[i] on a rolling basis averages out the deviation in the output.

One downside to such a DEM scheme is that as the number of unit elements implemented in the current mirror grows, the sampling and conversion rate of the ADC decreases due to obtaining the larger number of samples needed to determine the single averaged value. Another downside to such a DEM scheme is that while such a DEM scheme may work well for averaging out error in linear systems, the error in the unit elements is not necessarily linear. For example, the dimension deviations that occur in the unit elements may affect some resistors and transistors much more than others. While the DEM scheme attempts to average out an error within some standard deviation among the unit elements, the more affected unit elements may cause a much larger error than the standard deviation, resulting in the averaged output still having significant error. Further, some applications of DEM also translate error into noise, which degrades the signal to noise ratio (SNR). In other words, larger unit element error results in worse SNR. Additionally, the switching of each unit element to the second output node may introduce an undesirable voltage or current ripple in the output.

Alternatively, a conventional ordered element matching (OEM) scheme may be used to improve matching of the unit elements, which does not require switching through unit elements. During production of the temperature sensor (i.e., when the temperature sensor is being fabricated, at a time before runtime of the temperature sensor executed by a user), the unit elements may be sorted based on a test sample of the current output of each unit element, and then "folded" into N+1 groups. For example, a plurality of K unit elements may be used to implement N+1 unit groups, where K is an integer multiple of (N+1). The K unit elements are sorted into a sequence of U[0] to U[K], and a unit element U[j] from one end of the sequence is folded into or grouped with another unit element U[K−j] from the other end of the sequence, where j is an integer that is incremented by one from 0 to K/2. In other words, "folding the unit elements" means the unit elements are paired starting from the outside ends of the sequence to the center of the sequence. As a result, the most affected unit elements with larger errors are paired in such a way that the combined output of each pair averages out the large errors, which reduces the standard deviation of error for the combined outputs of the pairs.

The unit elements are grouped into larger groups with each subsequent folding, where each subsequent folding further reduces the standard deviation of error for the combined outputs of the groups. N unit groups are then selected and (permanently) tied to the first output node VN, and a single unit group is selected and tied to a second output node V1, without switching through the groups on a rolling basis like the DEM scheme described above. One downside to OEM is that it typically requires multiple foldings to achieve a desired standard deviation of error for the N+1 unit groups implemented in the resulting current mirror. For example, OEM typically requires three or four foldings of the number of unit elements to achieve good matching. Since each folding doubles the number of unit elements needed for the current mirror, the number of unit elements required for such an implementation quickly becomes excessive.

The present disclosure provides a high accuracy matching scheme used in circuits that implement a number of unit elements, also referred to herein as a dynamic ordered element matching (DOEM) scheme. The DOEM scheme is useful by reducing the unit element error, using less unit elements than typical OEM, improving matching performance, and reducing voltage ripple and noise level in some applications. Overall, a system that implements the DOEM scheme achieves orders of magnitude better performance than a system that implements OEM or DEM.

While the present disclosure is discussed in the context of a current mirror, the teachings of the present disclosure may be applicable to any circuit that implements unit elements, such as in analog to digital converters (ADCs), digital to analog converters (DACs), bandgap reference voltage generators, amplifiers, temperature sensors, and other applications where device matching is critical. The present disclosure also provides for on-chip matching, which may be performed either at a production time or during runtime of the circuit.

Figure 3:
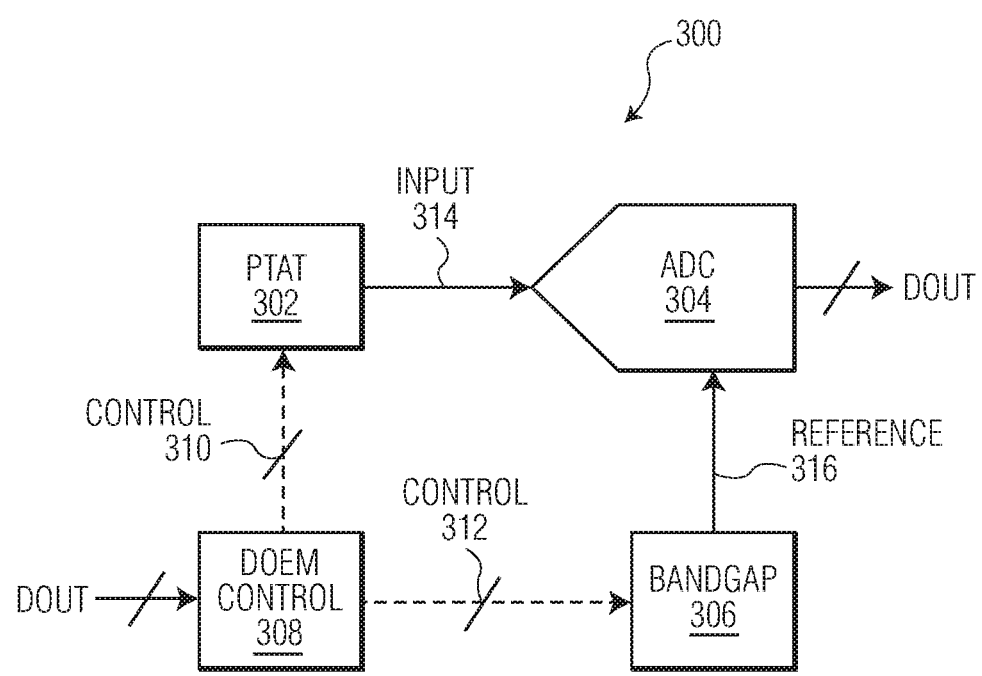
FIG. 3 is a block diagram depicting an example system on a chip in which the present disclosure may be implemented.

FIG. 3 is a block diagram depicting an example system on chip (SoC) 300 in which the present disclosure may be implemented. In the embodiment shown, SoC 300 implements an example temperature sensor device, which includes a proportional to absolute temperature (PTAT) source 302, an analog to digital converter (ADC) 304, a bandgap reference generator 306, and a dynamic ordered element matching (DOEM) control circuit module 308. Output DOUT of ADC 304 is an n-bit code that corresponds to a temperature reading (e.g., PTAT current, voltage), as further discussed below. These various components may be implemented on SoC 300 as a single integrated circuit (IC).

PTAT source 302 is configured to provide INPUT signal 314 to ADC 304, and bandgap generator 306 is configured to provide REFERENCE signal 316 to ADC 304. In some embodiments, PTAT source 302 is configured to generate a PTAT voltage, and bandgap generator 306 is configured to generate a reference voltage, where the voltages are provided as inputs to ADC 304. In other embodiments, PTAT source 302 is configured to generate a PTAT current, and bandgap generator 306 is configured to generate a reference current, where the currents are provided as inputs to ADC 304. The PTAT voltage or current is generated as a temperature-dependent value that increases (or decreases) in direct proportion to a change in temperature. The bandgap reference voltage or current is generated as a temperature-independent value that is generally constant over any change in temperature. ADC 304 is configured to digitize a relationship between the PTAT signal and the bandgap signal, either in voltage form or current form. For example, the ADC 304 may be configured to digitize the ratio of INPUT/REFERENCE signals, or the value of some other relationship between INPUT signal 314 and REFERENCE signal 316, depending on the implementation. While the PTAT source 302 is shown as separate from bandgap generator 306, the PTAT source 302 may be implemented as part of bandgap generator 306 in other embodiments. At least one of the PTAT source 302 and the bandgap generator 306 implement a current mirror. In the embodiment shown, both PTAT source 302 and bandgap generator 306 implement a current mirror.

DOEM control module 308 implements the DOEM matching scheme of the present disclosure in at least one current mirror implemented in SoC 300. DOEM control module 108 is implemented as logic circuitry configured to output a set of CONTROL signals 310 to implement the matching scheme in the current mirror in PTAT source 302, output a set of CONTROL signals 312 to implement the matching scheme in the current mirror in bandgap generator 306, or both. The CONTROL signals 310 and 312 are shown as broken line arrows, indicating that one or both sets of CONTROL signals 310 and 312 may be used, depending on the implementation (e.g., only one set of CONTROL signals 310 may be needed if only one current mirror is implemented in a combination PTAT source 302 and bandgap generator 306, or if only one of PTAT source 302 and bandgap generator 306 implement a current mirror). DOEM control module 308 also receives the ADC output code DOUT, which is used during a sampling portion of an initialization process of the DOEM matching operation, as further discussed below.

Figure 4:
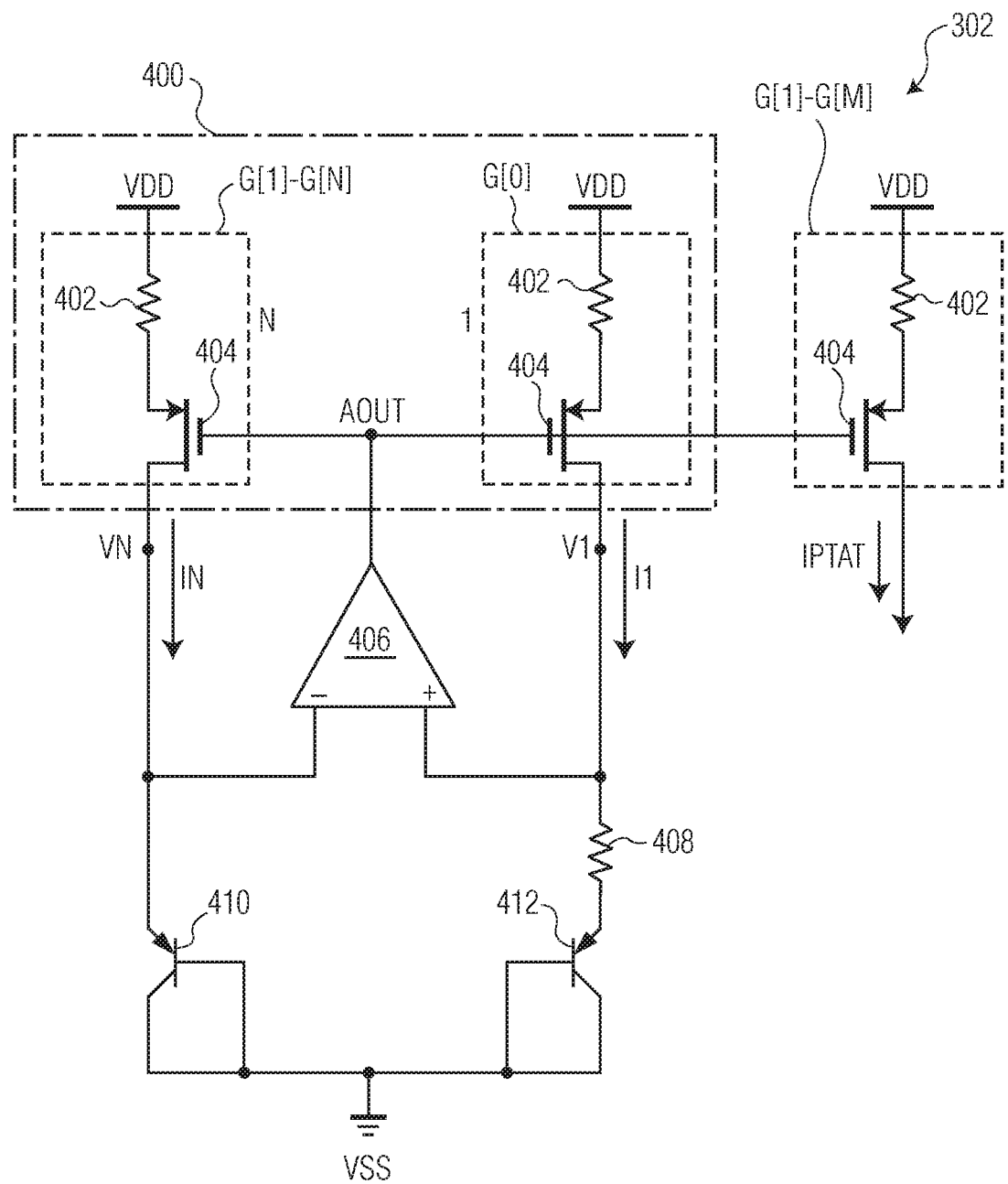
FIG. 4 is a schematic diagram depicting an example PTAT (proportional to absolute temperature) current source circuit in which the present disclosure may be implemented.

FIG. 4 is a schematic diagram depicting an example circuit implemented as PTAT source 302. Circuit 302 includes a current mirror 400 that implements a current ratio of N:1. A first branch (shown as the leftmost branch) provides current IN and a second branch (shown as the center branch) provides current I1, where IN is N times greater than I1, N being an integer equal to or greater than 1. The current mirror is implemented using N+1 unit element groups G[i], where the first branch is implemented using an N number of unit element groups (denoted as G[1]-[N]) coupled in parallel and the second branch is implemented using a single unit element group (denoted as G[0]), and where each unit element group G[i] includes two or more unit elements U[k] coupled in parallel. In the embodiment shown, each unit element U[k] includes a resistor 402 coupled between the first voltage supply and a source electrode of a transistor 404, such as a p-type MOSFET (where the source electrode is identified by an inward pointing arrow). Each unit element U[k] provides a unit current at the drain electrode of the transistor 404. The drain electrodes of the unit elements U[k] implemented in groups G[1]-[N] are coupled in parallel to a first output node of the first branch (denoted as VN), and the drain electrodes of the unit elements U[k] implemented in group G[0] are coupled in parallel to a second output node of the second branch (denoted as V1). In other embodiments, the unit elements U may not include resistor 402. In other embodiments, the unit elements U may each include cascoded transistors (or a first transistor having a drain electrode coupled to a source electrode of a second transistor) to form a cascoded current mirror 400.

The first output node VN is coupled to an inverting input of an amplifier 406 (as identified by the minus sign –), and the second output node V1 is coupled to a non-inverting input of amplifier 406 (as identified by the plus sign+). The gate electrodes of all transistors 404 implemented in both branches of the current mirror 400 are tied to an output of amplifier 406 labeled AOUT. The inverting (–) input of amplifier 406 is further coupled to an emitter electrode of bipolar junction transistor (BJT) 410, and the non-inverting (+) input of amplifier 406 is further coupled to an emitter electrode of BJT 412 through a resistor 408. The gate electrodes and collector electrodes of BJT 410 and 412 are tied at a second voltage supply (e.g., VSS). Amplifier 406 may be implemented using an operational amplifier (op amp) or other suitable circuitry that generally amplifies an input signal when connected in a closed loop (e.g., receives feedback).

A second current mirror is implemented to provide a current that is proportional to absolute temperature (denoted as IPTAT). In the embodiment shown, a third branch (shown as the rightmost branch) may also be implemented using an M number of groups G[1]-[M], where M is an integer equal to or greater than 1. Similar to current mirror 400, each of the M groups implements two or more unit elements U[k], where the gate electrodes of all transistors 404 implemented in the M groups are also tied to the AOUT output of amplifier 406. The drain electrodes of unit elements U[k] implemented in groups G[1]-[G[M] are coupled in parallel to an output node that provides IPTAT. As noted above, the unit elements U may not include resistor 402 in some embodiments, or may include cascoded transistors in other embodiments.

Regardless of the specific implementation of the unit elements U of the three current mirror branches, PTAT is based on the relationship between N and M. Using Kirchhoff's laws, the following equations are obtained:

$$\Delta V_{BE}(T) = \frac{kT}{q}\ln(N) \quad (1)$$

$$I_1 = \frac{\Delta V_{BE}}{R} \quad (2)$$

$$I_N = N\frac{\Delta V_{BE}}{R} \quad (3)$$

$$I_{PTAT} = M\frac{kT}{q \cdot R}\ln(N) \quad (4)$$

From equation 4, it is seen that error may be introduced into IPTAT if any device mismatch occurs. For example, if the current ratio actually implemented is less than N, the PTAT current will be reduced and the ADC output code will be smaller than expected. If the ratio is larger than N, the PTAT current will be increased and the ADC output code will be larger than expected. While not linear, the relationship between the current ratio and the ADC output code is monotonic, where an increase in the current ratio results in a corresponding increase in the ADC output code. Based on this relationship, the ADC output code can be used to sort the unit elements for the presently disclosed DOEM scheme.

Figure 5:
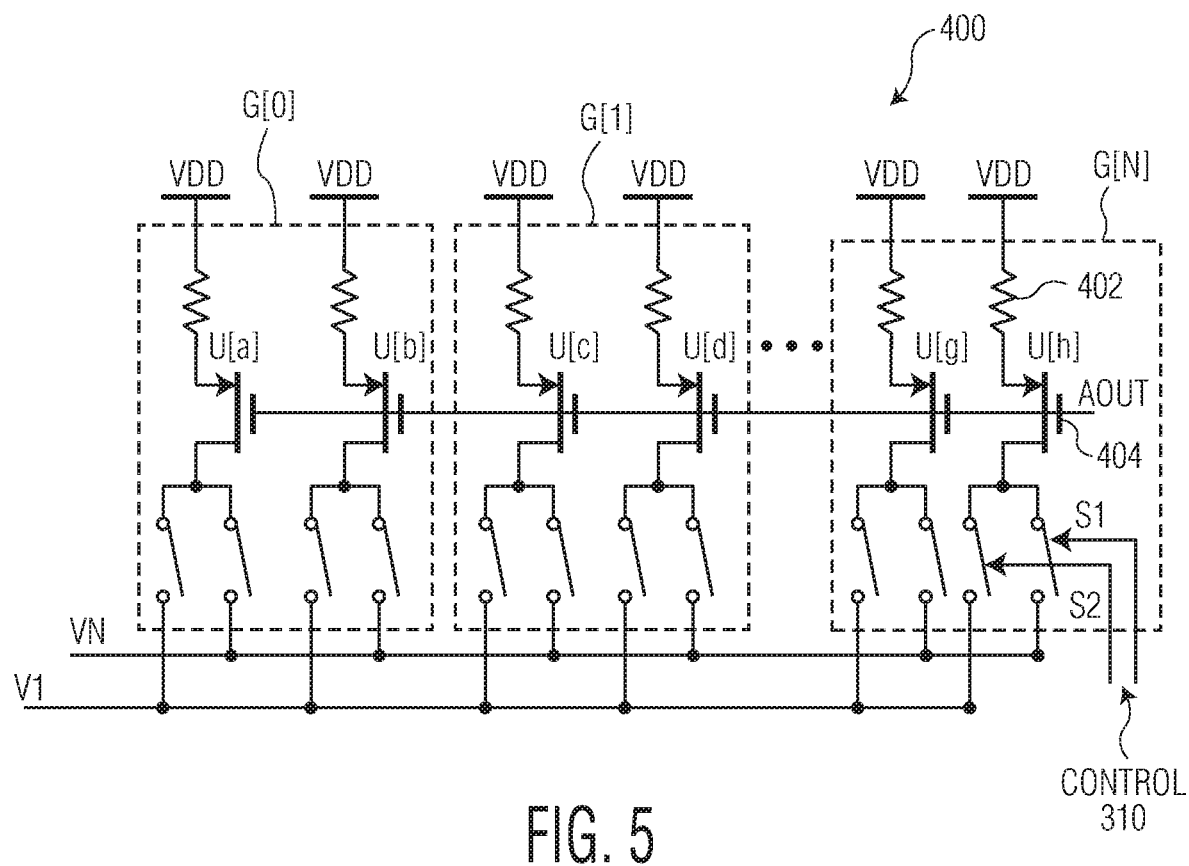
FIG. 5 is a schematic diagram depicting an example current mirror implemented using an N+1 number of groups, each group formed from a set of current unit elements, according to some embodiments of the present disclosure.

FIG. 5 is a schematic diagram depicting an example current mirror 400 that is implemented using an N+1 number of groups G, where each group G is implemented using at least two unit elements U. As noted above, each unit element U (such as U[h], shown on the right) has a resistor 402 coupled between the first voltage supply and a source electrode of a transistor 404. Each unit element U is coupled by way of a set of switches to a first output node (labeled VN) and a second output node (labeled V1). Each unit element U provides a unit element current at a drain electrode of the transistor 404, where the drain electrode is coupled to the first output node VN through a first switch S1 of the set of switches, and to the second output node V1 through a second switch S2 of the set of switches. Switches S1 and S2 each receive a respective CONTROL signal 310 from DOEM control module 308, which respectively controls the switches S1 and S2 to connect the drain electrode of transistor 404 to either the first output node VN or the second output node V1 (e.g., by closing one of switches S1 and S2 by making it conductive and complete the path between the first and second terminals of the switch, and opening the other switch by making the switch nonconductive and break the path between the first and second terminals of the switch). In some embodiments, switches S1 and S2 may be implemented using one or more transistors, such as n-channel or p-channel transistors, or other suitable switching devices.

As further discussed below, current mirror 400 is implemented using K times (N+1) unit elements, where K is an integer equal to or greater than 2. According to the DOEM scheme provided herein, an initialization process may be performed at a production time or during runtime, which is made possible due to the DOEM control module 308 implemented on-chip. The K(N+1) unit elements are sampled, sorted, and folded into N+1 groups an F number of times. Depending on the number of F foldings (where F is an integer equal to or greater than 1) and the total number of T unit elements needed to implement the N:1 ratio of current mirror circuit, the minimum number of unit elements needed to implement the current mirror circuit is $$(N+1) \cdot 2^F.$$

In the example shown in FIG. 5, a ratio of 2:1 may be achieved by 3 groups, each group including 2 unit elements, for a total of 6 unit elements that have been folded once (or N=2, F=1). Group G[0] includes unit elements U[a] and U[b], group G[1] includes U[c] and U[d], and group G[N] includes unit elements U[g] and U[h]. In other embodiments, a larger number of unit elements may be used, such as 12 unit elements that have been folded twice into 3 groups that each include 4 unit elements (or N=2, F=2). In other words, each F folding doubles the number of unit elements U included in a single group G, where K=2*F and T=K(N+1).

Figure 6:
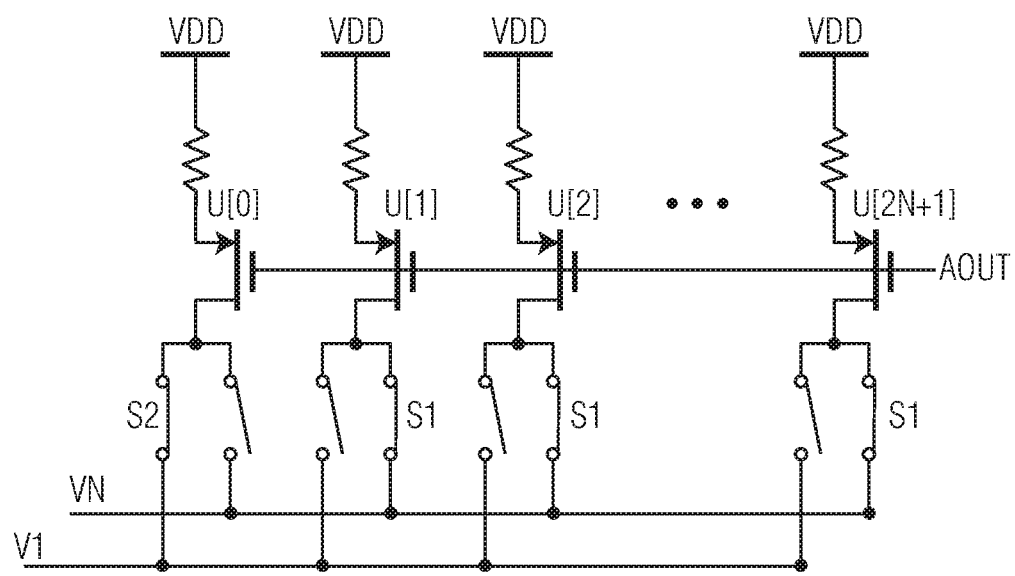
FIGS. 6 and 7 are schematic diagrams depicting an example sampling process for initializing the groups, according to some embodiments of the present disclosure.
Figure 7:
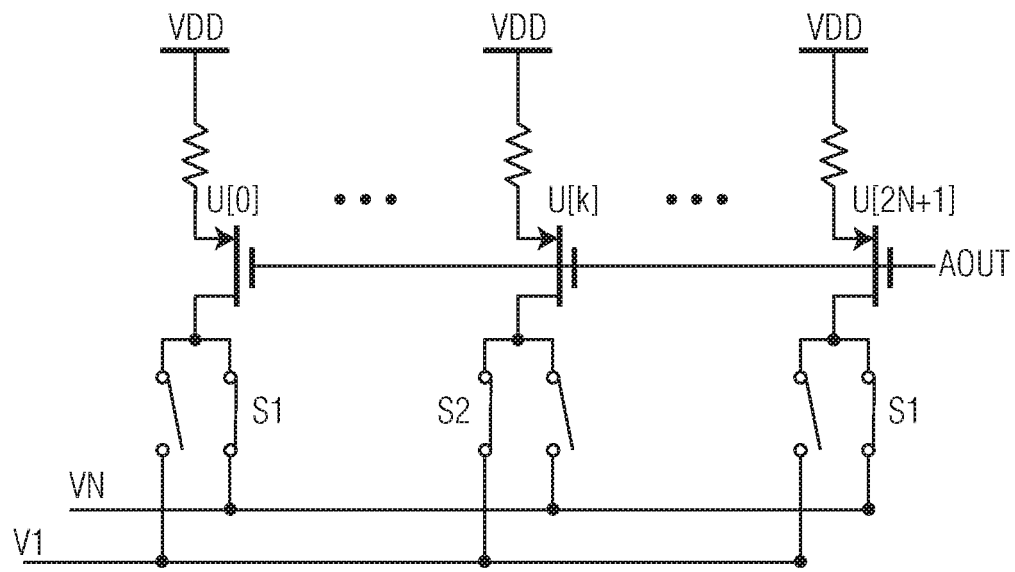

FIGS. 6 and 7 are schematic diagrams depicting sampling steps of an example initialization process of the DOEM matching scheme. In one embodiment of the initialization process, DOEM control module 308 is configured to couple each unit element (or unit) U individually to V1 on a rolling basis, while the remaining unit elements are coupled to VN. For each unit U, the ADC 304 takes a sample and outputs a respective output code, which is provided to DOEM control module 308. It is noted that in the embodiment shown, the K(N+1) units are denoted as units U[0] through U[K(N+1)−1], or U[0] through U[KN+K−1]. When K=2, the units are denoted as units U[0] through U[2N+1]. Continuing the above example (where N=2, F=1, and K=2), FIG. 6 shows unit U[0] is connected to node V1 through its switch S2, while the remaining units U[1]-U[2N+1] are connected to node VN through their respective switches S1. ADC 304 takes a sample and outputs a code, which DOEM control module 308 associates with unit U[0]. DOEM control module 308 records the respective output code and an identifier for the respective unit U, such as in a buffer or in a storage table in memory local to DOEM control module 308. DOEM control module 308 iterates through the units, as shown in FIG. 7, where a subsequent unit U[k] is connected to node V1 through its switch S2, while the remaining units are connected to node VN through their respective switches S1.

Figure 11A:
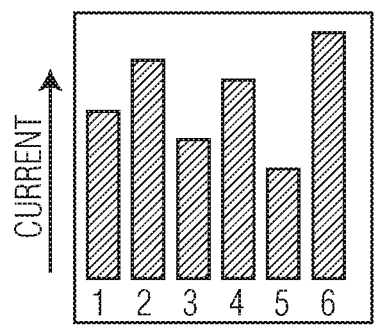
Figure 11B:
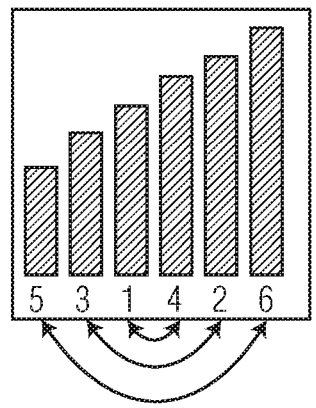
Figure 11C:
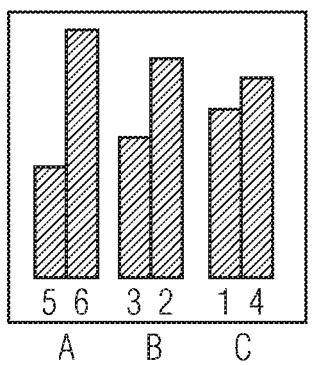
Figure 11D:
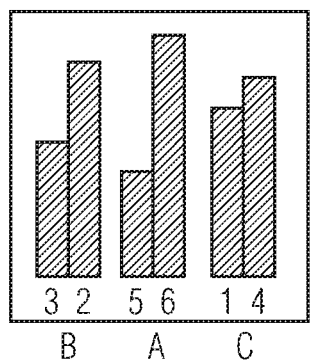
Figure 11E:
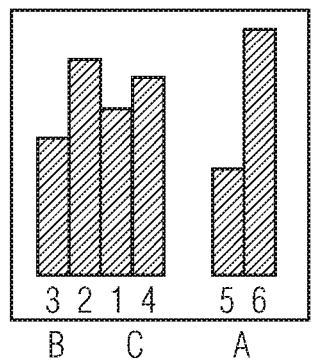

After rotating through each unit U and recording the respective output code and associated unit identifier, DOEM control module 308 sorts the values of the output codes in ascending order, which also sorts units U[0]-U[2N+1] into an ordered sequence. FIG. 11A shows a bar graph, where each bar corresponds to an amount of current sampled when a respective unit U is connected to output node V1. As shown, each unit has some associated deviation, some units experiencing greater deviation than others. FIG. 11B shows the units sorted by current in increasing or ascending order, resulting in a sequence of units. DOEM control module 308 then performs at least one folding operation on the resulting sequence, starting from the ends of the sequence. Unit UM from one end of the sequence is folded into or grouped with another unit element U[(KN+K−1)−j] from the other end of the sequence, where j is an integer that is incremented by one from 0 to [K(N+1)]/2. In other words, "folding the unit elements" means the unit elements are paired starting from the outside ends of the sequence to the center of the sequence. As shown in FIG. 11B, the outer units in first and last place of the sequence are associated into a first group A, the next interior units are associated into a second group B, and the next (and final) inner units are associated into a third group C. DOEM control module 308 may also store a group identifier with each unit in the storage table. In some embodiments, additional sorting and folding operations may be performed. For example, FIG. 11D shows another sorting step performed on the groups, where the average output of the groups are sorted in ascending order, and FIG. 11E shows another folding step, which folds group B into C to achieve the N:1 ratio.

As a result, groups G[0]-G[N] are formed from the K(N+1) units. An example storage table is provided below, where each unit U is associated with its respective output code value (where the n-bit code is represented as a single digit) and respective group G. In some embodiments, the code value may be stored temporarily and discarded after the final ordered sequence is obtained. DOEM control module 308 may output CONTROL signals 310 (and 312) to connect the units to the proper output node, based on the associations between groups and units provided in the storage table. Outliers may also be removed to further reduce the standard deviation of the outputs of the groups and improve performance, as further described below in connection with FIG. 12A-12C. DOEM control module 308 may also dynamically rotate through each group as the single group connected to the second branch (or node V1) to average out any remaining error, as further described below in connection with FIG. 11E-11G.

TABLE 1

Example storage table with associated output code value

| Group | Unit | Code Value |
|---|---|---|
| G[0] | U[5] | 1 |
| G[0] | U[6] | 6 |
| G[1] | U[3] | 2 |
| G[1] | U[2] | 5 |
| . . . | | |
| G[N] | U[1] | 3 |
| G[N] | U[4] | 4 |

Figure 12A:
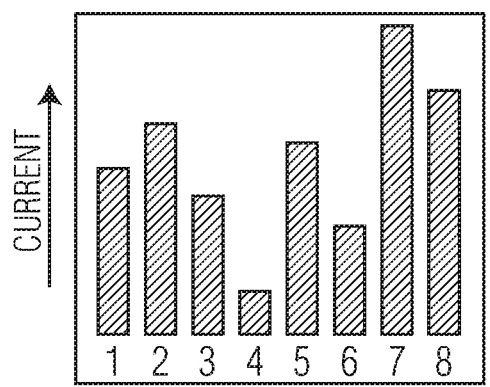
FIGS. 12A, 12B, and 12C are bar graphs depicting example optional steps of the DOEM process, according to some embodiments of the present disclosure.
Figure 12B:
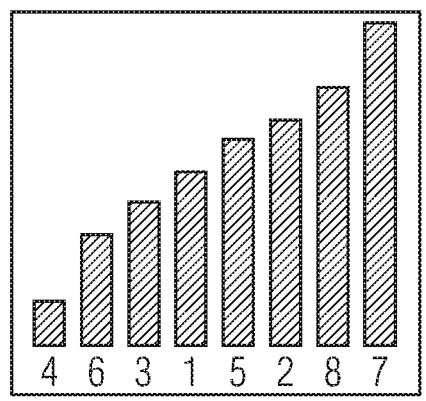
Figure 12C:
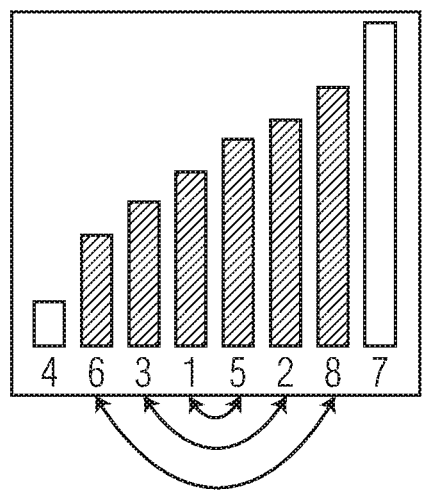

FIGS. 12A, 12B, and 12C show an optional outlier discard process. As shown in FIG. 12A, a number of unit elements greater than the minimum required are available for implementation in a current mirror 400 that implements a ratio of N:1. For example, 8 unit elements are available to implement a ratio of 2:1, which requires a minimum of 6 unit elements. Each unit element is sampled on a rolling basis (as described above in connection with FIG. 11A) to determine a respective output code for each unit element. FIG. 12B shows the output codes sorted in ascending order, which also sorts the unit elements. It can be seen that deviation is greatest in the outliers, shown as units 4 and 7. In order to minimize this deviation, the outliers are discarded (or ignored), as shown in FIG. 12C by being crossed-out. The remaining unit elements are then folded, as shown by curved arrows at the bottom of FIG. 12C, where the remaining process continues as described above in connection with FIG. 11C.

Figure 11F:
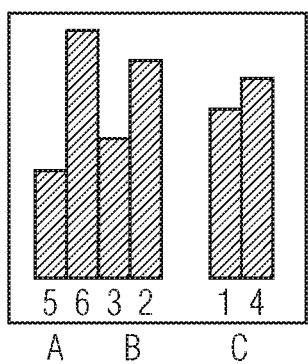
Figure 11G:
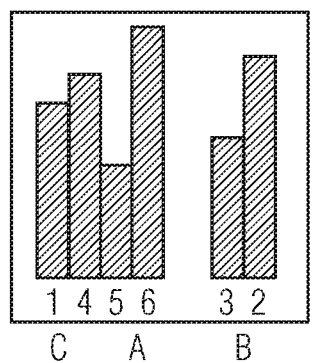

FIGS. 11E, 11F, and 11G further show a runtime process of the DOEM matching scheme, where a single group is selected from the N+1 groups for connection to V1 on a rolling basis, while the remaining N number of groups are connected to VN. Continuing the above example of SoC 300 implemented as a temperature sensor, FIG. 11E shows DOEM control module 308 selecting groups B and C for connection to VN and selecting group A for connection to V1, where a first temperature reading may be taken by the ADC 304. FIG. 11F shows DOEM control module 308 next selecting groups A and B for connection to VN and selecting group C for connection to V1, where a second temperature reading may be taken by the ADC 304. FIG. 11G shows DOEM control module 308 next selecting groups C and A for connection to VN and selecting group B for connection to V1, where a third temperature reading may be taken by the ADC 304. The three temperature readings may be averaged to result in a single temperature reading with greatly reduced error.

Figure 8:
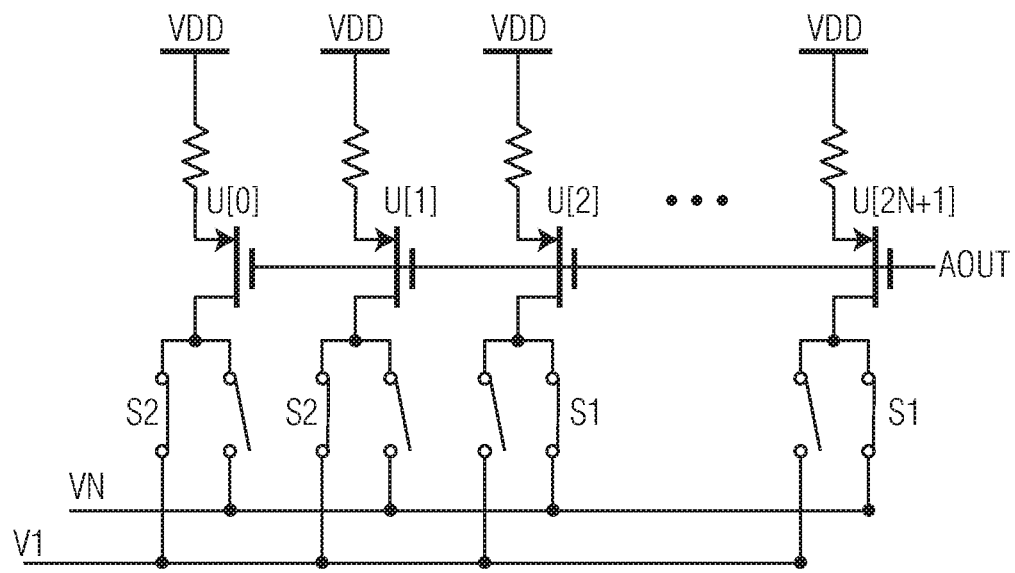
FIGS. 8, 9, and 10 are schematic diagrams depicting another example sampling process for initializing the groups, according to some embodiments of the present disclosure.
Figure 9:
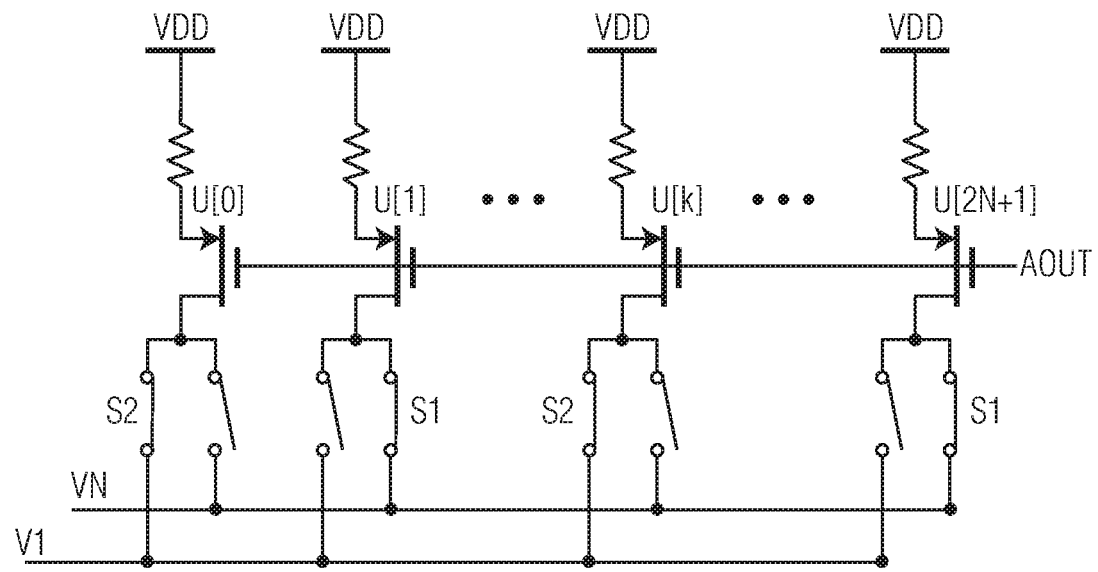
Figure 10:
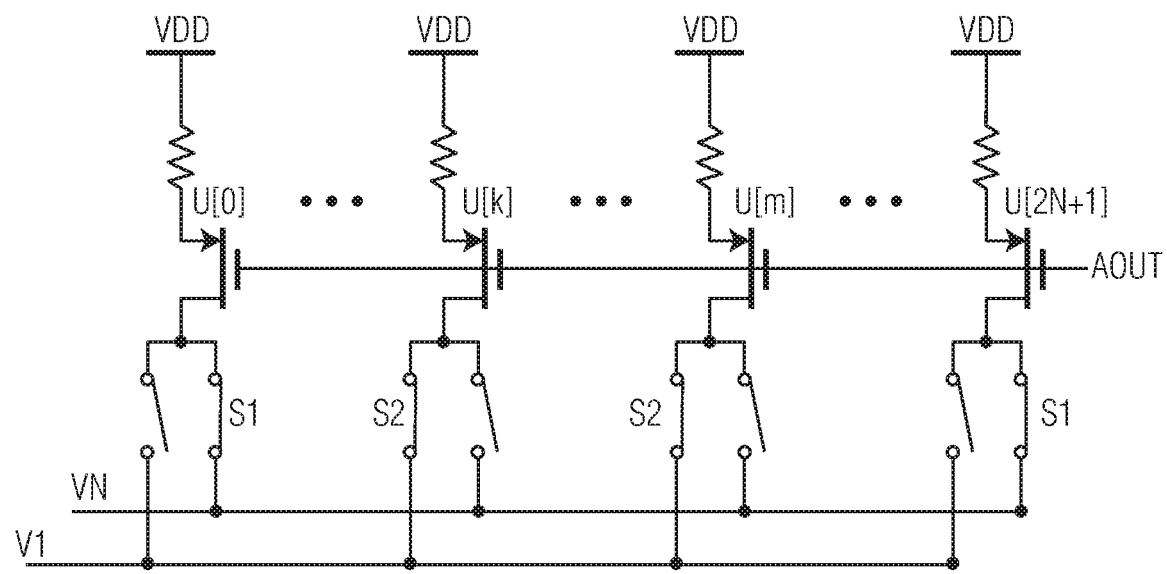

FIGS. 8, 9, and 10 are schematic diagrams depicting sampling steps of another example initialization process of the DOEM matching scheme, which may be implemented in other embodiments where two or more units are sampled simultaneously. A first sampling portion of the initialization process is shown in FIGS. 8 and 9, where units U[0] and U[1] are connected to node V1 through their respective switches S2, while the remaining 2N units are connected to node VN through their respective switches S1. ADC 304 takes a sample and outputs a code, which DOEM control module 308 associates with unit U[1] and records in the storage table. Leaving unit U[0] connected to node V1, DOEM control module 308 connects a next unit U[k] (such as unit U[2]) to node V1, while switching the remaining 2N units (including unit U[1] that was previously connected to node V1) to node VN, which is shown in FIG. 9. ADC 304 takes a sample and outputs a code, which DOEM control module 308 associates with unit U[k] and records in a temporary storage table. In other words, DOEM control module 308 leaves unit U[0] connected to node V1, while iterating through the units U[1]-U[2N+1] to connect a respective unit U[k] to node V1 and recording each output code associated with the respective unit U[k] in the temporary storage table.

While these output codes may be used to sort the units U[1]-U[2N+1], the output code corresponding to unit U[0] has not yet been determined. In order to compare unit U[0] with the other units U[1]-U[2N+1], the units U[1]-U[2N+1] are sorted based on the output code values in the temporary storage table into an initial sequence, and a maximum unit U[m] is determined from the initial sequence, which is the unit that has a maximum output code, also referred to as a unit in the maximum position. A second sampling portion of the initialization process is shown in FIG. 10, where unit U[m] is connected to node V1, and unit U[0] (which was previously connected to node V1) is connected to output node VN. In one embodiment, DOEM control module 308 implements a sampling process similar to that discussed above in connection with FIGS. 8 and 9, where DOEM control module 308 leaves unit U[m] connected to node V1, while iterating through the remaining ones of units U[1] through U[2N+1] to connect a respective unit U[k] to node V1 and recording each output code associated with the respective unit U[k], such as in a primary storage table. DOEM control module 308 sorts the values of the output codes obtained during the second sampling portion of the initialization process in ascending order, which also sorts units U[1]-U[2N+1] into an ordered sequence in the primary storage table.

Since the output code value for U[0]+U[m] is known from the first sampling portion of the initialization process, DOEM control module 308 associates the known output code value of U[0]+U[m] with unit U[0], and uses the known output code value to sort unit U[0] among the ordered units stored in the primary storage table. If unit U[0] is sorted into any position within the ordered sequence of units other than the maximum position, then unit U[m] is marked as the unit with maximum output code value in the ordered sequence. If unit U[0] is sorted into the maximum position of the ordered sequence, then the larger of U[0] and U[m] must still be determined. In such a case, any other unit U[x] (excluding unit U[0] and U[m]) is selected and connected to node V1. DOEM control module 308 connects U[x] and U[0] to node V1 (with the remaining 2N units connected to node VN) to obtain a first output code, and then connects U[x] and U[m] to node V1 (with the remaining 2N units connected to node VN) to obtain a second output code. The larger output code is used to determine the larger of U[0] and U[m], which is marked as the unit with maximum output code value in the ordered sequence. For example, if U[x]+U[m] has a larger output code value than U[x]+U[0], then unit U[m] is placed as the unit in the maximum position, and unit U[0] is placed in the penultimate or next-to-maximum position. Once the ordered sequence is complete, the temporary storage table may be discarded, and the output code values in the primary storage table may also be discarded. DOEM control module 308 is configured to implement the group and unit associations described in the primary storage table.

In another embodiment, rather than iterating through all of the remaining 2N units in the second sampling portion, a binary search or half-interval approach may be used to determine where U[0] falls in the ordered sequence. For example, DOEM control module 308 may connect U[m] and a unit U[k] that is positioned in the middle of the initial sequence, dividing the initial sequence into a first half and a second half. A first output code is obtained and compared to the output code for U[k]+U[m]. If the code value U[0]+U[m] is less than the first output code, DOEM control module 308 may continue the search in the first half of the initial sequence by selecting a next unit U[k] that is positioned in the middle of the first half. If the code value U[0]+U[m] is greater than the first output code, DOEM control module 308 may continue the search in the second half of the initial sequence by selecting a next unit U[k] that positioned in the middle of the second half. In both cases, the code value of U[0]+U[m] is compared with U[k]+U[m], and the above process repeats until the binary search hones in on a position adjacent to at least one unit, such as between two adjacent units that "sandwich" the code value U[0]+U[m], or in a minimum position where all units have larger code values than U[0]+U[m]. As similarly discussed above, if the code value U[0]+U[m] is determined to be in the maximum position where all units have smaller code values than U[0]]+U[m], then any other unit U[x] (excluding unit U[0] and U[m]) is selected and connected to node V1 to determine the greater of U[0] and U[m].

The above described DOEM scheme achieves significant matching improvements, enabling the use of less accurate elements to realize high accuracy circuits. Several statistical simulations were performed implementing the DOEM scheme described herein for 10,000 times, and the standard deviation achieved for the groups (using DOEM scheme) is compared with the standard deviation of the units in the results table below. It can be seen that a much smaller standard deviation can be achieved for the groups, even when the deviation of the units is large. The standard deviation of an OEM scheme and DEM scheme is also provided below, for comparison's sake with DOEM. The DOEM scheme provides the best performance, reducing standard deviation by a factor of 100 or greater in most simulations.

TABLE 2

Case variables

| | # of units | OEM | DEM | DOEM |
|---|---|---|---|---|
| Case 1 | 8 | 1 folding | — | F = 0 |
| Case 2 | 16 | 2 folding | — | F = 1 |
| Case 3 | 32 | 3 folding | — | F = 1 |
| Case 4 | 36 | 4 outliers removed, 3 folding | — | 4 outliers removed, F = 1 |
| Case 5 | 36 | current unit elements having ~50% std deviation | | |

TABLE 3

Results Table

| | Std Dev - No calibration | Std Dev - OEM | Std Dev - DEM | Std Dev - DOEM |
|---|---|---|---|---|
| Case 1 | 0.02 | 0.015 | 0.0012 | 0.0012 |
| Case 2 | 0.014 | 0.0035 | 0.0005 | 0.00007 |
| Case 3 | 0.01 | 0.0012 | 0.00024 | 0.000009 |
| Case 4 | 0.01 | 0.00068 | 0.00024 | 0.000003 |
| Case 5 | 0.05 | 0.0034 | 0.0073 | 0.00007 |

Generally, there is provided, a circuit including an analog to digital converter (ADC) configured to generate an output code; a current source configured to provide an input signal to the ADC, the current source comprising a first current branch including a first unit element group, the first unit element group comprising a first unit element coupled by way of a first set of switches to a first node and a second node and a second unit element coupled by way of a second set of switches to the first node and the second node; and a second current branch including a second unit element group, the second unit element group comprising a third unit element coupled by way of a third set of switches to the first node and the second node and a fourth unit element coupled by way of a fourth set of switches to the first node and the second node; and a control circuit configured to provide control signals to the sets of switches based on the output code, the control circuit further configured to sort unit element currents and to dynamically switch unit elements during an element matching operation. Each unit element in the first and second unit element groups may be coupled between a first voltage supply and respective terminals of a set of switches, each unit element may include a resistor and a transistor coupled in series and configured to provide a unit element current. The circuit may further include an amplifier having a first input coupled to the first node, a second input coupled to the second node, and an output coupled to the gate electrodes of the transistor in each unit element. The circuit may further include a first bipolar junction transistor (BJT) having an emitter electrode coupled at the first node and gate and collector electrodes coupled at a second voltage supply; and a second BJT having an emitter electrode coupled to the second node by way of a resistor and gate and collector electrodes coupled at the second voltage supply. The current source may be characterized as a proportional to absolute temperature (PTAT) current source and may be further configured to generate the input signal as a ratio based on the first current branch and the second current branch. The current source may further include a third current branch including a third unit element group configured to provide a PTAT current, the third unit element group including one or more unit elements. A value of the output code may correspond to a unit element current during a sampling portion of an initialization process of an element matching scheme. The circuit may further include a bandgap reference generator configured to provide a reference signal to the ADC. The output code may correspond to a ratio of the input and the reference signals.

In another embodiment, there is provided, a circuit including an analog to digital converter (ADC) configured to generate an output code; a current source coupled to the ADC, the current source comprising: a first current branch including a first unit element group, the first unit element group comprising a first unit element coupled by way of a first set of switches to a first node and a second node and a second unit element coupled by way of a second set of switches to the first node and the second node; and a second current branch including a second unit element group, the second unit element group comprising a third unit element coupled by way of a third set of switches to the first node and the second node and a fourth unit element coupled by way of a fourth set of switches to the first node and the second node; and a control circuit configured to provide control signals to the sets of switches based on the output code, the control circuit further configured to sort unit element currents represented by output code values and to dynamically rotate through each unit element group as a single group connected to the second current branch to average out error during an element matching operation. Each unit element in the first and second unit element groups may be coupled between a first voltage supply and respective terminals of a set of switches, each unit element including a resistor and a transistor coupled in series and configured to provide a unit element current. The circuit may further include an amplifier having a first input coupled to the first node, a second input coupled to the second node, and an output coupled to the gate electrodes of the transistor in each unit element. The circuit may further include a first bipolar junction transistor (BJT) having an emitter electrode coupled at the first node and gate and collector electrodes coupled at a second voltage supply; and a second BJT having an emitter electrode coupled to the second node by way of a resistor and gate and collector electrodes coupled at the second voltage supply. The current source may further include a third current branch including a third unit element group configured to provide a PTAT current, the third unit element group including one or more unit elements. The circuit may further include a bandgap reference generator configured to provide a reference signal to the ADC. The current source may be configured to provide an input signal to the ADC, and wherein the output code corresponds to a ratio of the input and the reference signals.

In yet another embodiment, there is provided, a method including generating an output code by way of an analog to digital converter (ADC); providing an input signal to the ADC by way of a current source, the current source comprising: a first current branch coupled to a first voltage supply and including a first unit element group, the first unit element group comprising a first unit element coupled by way of a first set of switches to a first node and a second node and a second unit element coupled by way of a second set of switches to the first node and the second node; and a second current branch coupled to the first voltage supply and including a second unit element group, the second unit element group comprising a third unit element coupled by way of a third set of switches to the first node and the second node and a fourth unit element coupled by way of a fourth set of switches to the first node and the second node; during an element matching operation controlling the sets of switches based on the output code; sorting unit element currents represented by output code values; and dynamically rotating through each unit element group as a single group connected to the second current branch. The sorting unit element currents step may occur before the dynamically rotating through each unit element group step. The current source may further include an amplifier having a first input coupled to the first node, a second input coupled to the second node, and an output coupled to a gate electrode of a transistor in each unit element. The method may further include a first bipolar junction transistor (BJT) having an emitter electrode coupled at the first node and gate and collector electrodes coupled to a second voltage supply; and a second BJT having an emitter electrode coupled to the second node by way of a resistor and gate and collector electrodes coupled at the second voltage supply.

By now it should be appreciated that there has been provided a high accuracy matching scheme used in circuits that implement a number of unit elements, also referred to herein as a dynamic ordered element matching (DOEM) scheme. The DOEM scheme is useful by reducing the unit element error, using less unit elements than typical OEM, improving matching performance, and reducing voltage ripple and noise level in some applications. Overall, a system that implements the DOEM scheme achieves orders of magnitude better performance than a system that implements OEM or DEM.

The circuitry described herein may be implemented on a semiconductor substrate, which can be any semiconductor material or combinations of materials, such as gallium arsenide, silicon germanium, silicon-on-insulator (SOI), silicon, monocrystalline silicon, the like, and combinations of the above.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode).

The following description refers to nodes or features being "connected" or "coupled" together. As used herein, unless expressly stated otherwise, "coupled" means that one node or feature is directly or indirectly joined to (or is in direct or indirect communication with) another node or feature, and not necessarily physically. As used herein, unless expressly stated otherwise, "connected" means that one node or feature is directly joined to (or is in direct communication with) another node of feature. For example, a switch may be "coupled to a plurality of nodes, but all of those nodes need not always be "connected" to each other; the switch may connect different nodes to each other depending upon the state of the switch. Furthermore, although the various schematics shown herein depict certain example arrangements of elements, additional intervening elements, devices, features, or components may be present in an actual embodiment (assuming that the functionality of the given circuit is not adversely affected).

Although the invention is described herein with reference to specific embodiments, various modifications and changes can be made without departing from the scope of the present invention as set forth in the claims below. For example, additional or fewer unit elements may be implemented in FIG. 5. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:
1. A circuit comprising:
an analog to digital converter (ADC) configured to generate an output code;

a current source configured to provide an input signal to the ADC, the current source comprising:
  a first current branch including a first unit element group, the first unit element group comprising a first unit element coupled by way of a first set of switches to a first node and a second node and a second unit element coupled by way of a second set of switches to the first node and the second node; and
  a second current branch including a second unit element group, the second unit element group comprising a third unit element coupled by way of a third set of switches to the first node and the second node and a fourth unit element coupled by way of a fourth set of switches to the first node and the second node; and
  a control circuit configured to provide control signals to the sets of switches based on the output code, the control circuit further configured to sort unit element currents and to dynamically switch unit elements during an element matching operation, wherein the output code is used to sort the unit element currents based on a relationship between a current ratio and the output code.

2. The circuit of claim 1, wherein each unit element in the first and second unit element groups is coupled between a first voltage supply and respective terminals of a set of switches, each unit element comprising a resistor and a transistor coupled in series and configured to provide a unit element current.

3. The circuit of claim 2, further comprising an amplifier having a first input coupled to the first node, a second input coupled to the second node, and an output coupled to the gate electrodes of the transistor in each unit element.

4. The circuit of claim 3, further comprising:
  a first bipolar junction transistor (BJT) having an emitter electrode coupled at the first node and gate and collector electrodes coupled at a second voltage supply; and
  a second BJT having an emitter electrode coupled to the second node by way of a resistor and gate and collector electrodes coupled at the second voltage supply.

5. The circuit of claim 1, wherein the current source is characterized as a proportional to absolute temperature (PTAT) current source and further configured to generate the input signal as a ratio based on the first current branch and the second current branch.

6. The circuit of claim 5, wherein the current source further comprises a third current branch including a third unit element group configured to provide a PTAT current, the third unit element group comprising one or more unit elements.

7. The circuit of claim 1, wherein a value of the output code corresponds to a unit element current during a sampling portion of an initialization process of an element matching scheme.

8. The circuit of claim 1, further comprising a bandgap reference generator configured to provide a reference signal to the ADC.

9. The circuit of claim 8, wherein the output code corresponds to a ratio of the input and the reference signals.

10. A circuit comprising:
  an analog to digital converter (ADC) configured to generate an output code;
  a current source coupled to the ADC, the current source comprising:
    a first current branch including a first unit element group, the first unit element group comprising a first unit element coupled by way of a first set of switches to a first node and a second node and a second unit element coupled by way of a second set of switches to the first node and the second node; and
    a second current branch including a second unit element group, the second unit element group comprising a third unit element coupled by way of a third set of switches to the first node and the second node and a fourth unit element coupled by way of a fourth set of switches to the first node and the second node; and
  a control circuit configured to provide control signals to the sets of switches based on the output code, the control circuit further configured to sort unit element currents represented by output code values wherein the output code is used to sort the unit element currents based on a relationship between a current ratio and the output code and to dynamically rotate through each unit element group as a single group connected to the second current branch to average out error during an element matching operation.

11. The circuit of claim 10, wherein each unit element in the first and second unit element groups is coupled between a first voltage supply and respective terminals of a set of switches, each unit element comprising a resistor and a transistor coupled in series and configured to provide a unit element current.

12. The circuit of claim 11, further comprising an amplifier having a first input coupled to the first node, a second input coupled to the second node, and an output coupled to the gate electrodes of the transistor in each unit element.

13. The circuit of claim 12, further comprising:
  a first bipolar junction transistor (BJT) having an emitter electrode coupled at the first node and gate and collector electrodes coupled at a second voltage supply; and
  a second BJT having an emitter electrode coupled to the second node by way of a resistor and gate and collector electrodes coupled at the second voltage supply.

14. The circuit of claim 10, wherein the current source further comprises a third current branch including a third unit element group configured to provide a PTAT current, the third unit element group comprising one or more unit elements.

15. The circuit of claim 10, further comprising a bandgap reference generator configured to provide a reference signal to the ADC.

16. The circuit of claim 15, wherein the current source is configured to provide an input signal to the ADC, and wherein the output code corresponds to a ratio of the input and the reference signals.

17. A method comprising:
  generating an output code by way of an analog to digital converter (ADC);
  providing an input signal to the ADC by way of a current source, the current source comprising:
    a first current branch coupled to a first voltage supply and including a first unit element group, the first unit element group comprising a first unit element coupled by way of a first set of switches to a first node and a second node and a second unit element coupled by way of a second set of switches to the first node and the second node; and
    a second current branch coupled to the first voltage supply and including a second unit element group, the second unit element group comprising a third unit element coupled by way of a third set of switches to the first node and the second node and a fourth unit element coupled by way of a fourth set of switches to the first node and the second node;
  during an element matching operation:

controlling the sets of switches based on the output code;

sorting unit element currents represented by output code values wherein the output code is used to sort the unit element currents based on a relationship between a current ratio and the output code; and dynamically rotating through each unit element group as a single group connected to the second current branch.

18. The method of claim 17, wherein the sorting unit element currents step occurs before the dynamically rotating through each unit element group step.

19. The method of claim 17, wherein the current source further comprises an amplifier having a first input coupled to the first node, a second input coupled to the second node, and an output coupled to a gate electrode of a transistor in each unit element.

20. The method of claim 19, further comprising:

a first bipolar junction transistor (BJT) having an emitter electrode coupled at the first node and gate and collector electrodes coupled to a second voltage supply; and a second BJT having an emitter electrode coupled to the second node by way of a resistor and gate and collector electrodes coupled at the second voltage supply.

* * * * *